(12) United States Patent
Liang et al.

(10) Patent No.: US 10,021,242 B1
(45) Date of Patent: Jul. 10, 2018

(54) VOLTAGE MONITORING CIRCUIT AND VOLTAGE MONITORING METHOD

(71) Applicants: INVENTEC (PUDONG) TECHNOLOGY CORPORATION, Shanghai (CN); INVENTEC CORPORATION, Taipei (TW)

(72) Inventors: Lei Liang, Shanghai (CN); Xiao-Bing Zou, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/870,540

(22) Filed: Jan. 12, 2018

(30) Foreign Application Priority Data

Jul. 5, 2017 (CN) .......................... 2017 1 0542281

(51) Int. Cl.
*G01R 19/165* (2006.01)
*G01R 19/14* (2006.01)
*H01M 10/48* (2006.01)
*H04M 3/26* (2006.01)
*H04Q 3/42* (2006.01)
*H04M 19/00* (2006.01)

(52) U.S. Cl.
CPC .............. *H04M 3/26* (2013.01); *G01R 19/14* (2013.01); *G01R 19/165* (2013.01); *H04M 19/005* (2013.01); *H04Q 3/42* (2013.01)

(58) Field of Classification Search
CPC ...................................................... H04M 2/26
See application file for complete search history.

(56) References Cited

U.S. PATENT DOCUMENTS

| 8,450,989 B2 * | 5/2013 | Wiktor | H02M 3/156 323/283 |
| 2005/0270848 A1 * | 12/2005 | Chae | G11C 16/30 365/185.23 |
| 2014/0012529 A1 * | 1/2014 | Lee | G01C 5/06 702/94 |
| 2016/0172977 A1 * | 6/2016 | Cai | H02M 1/14 323/271 |

* cited by examiner

*Primary Examiner* — Joseph Feild
*Assistant Examiner* — Pameshanand Mahase
(74) *Attorney, Agent, or Firm* — Maschoff Brennan

(57) ABSTRACT

The voltage monitoring circuit includes a first multiplexer, a controller, a resistor-network circuit and a first comparison circuit. The first multiplexer receives a plurality of first subject voltages. The controller controls the first multiplexer to output one of the plurality of first subject voltages and generates a testing signal including a plurality of electric potentials. The controller is configured to output the plurality of electric potentials switching according to a switch command. The resistor-network circuit is configured to sequentially generate a plurality of first reference voltages according to switches of the plurality of potentials. The first comparison circuit is configured to sequentially compare each of the plurality of first reference voltages to the first subject voltage for sequentially outputting a plurality of first comparing results and sending the plurality of first comparing results to the controller so that a voltage value of the first subject voltage is determined.

9 Claims, 5 Drawing Sheets

VOLTAGE MONITORING CIRCUIT AND VOLTAGE MONITORING METHOD

CROSS-REFERENCE TO RELATED APPLICATIONS

This non-provisional application claims priority under 35 U.S.C. § 119(a) on Patent Application No(s). 201710542281.7 filed in China on Jul. 5, 2017, the entire contents of which are hereby incorporated by reference.

TECHNICAL FIELD

The disclosure relates to a voltage monitoring circuit and a voltage monitoring method, more particularly to a voltage monitoring circuit and a voltage monitoring method using a resistor-network circuit.

BACKGROUND

An analog to digital converter (ADC) is a commonly used circuit, mainly adapted to convert analog signals into digital signals. When a server is designed, ADC circuits are often used for monitoring voltage of each channel within the server or to identify ID voltages of different boards. In the field of conventional ADC circuits, it is common to use ADC chips with an inter-integrated circuit ($I^2C$) type or to use differential ports of a CPLD so as to design an ADC-based conversion circuit using RC integration principle.

However, it would cost a lot if ADC chips with $I^2C$ type are used. If differential ports of a CPLD are used, then the conversion circuit, designed according to the integral comparators of the ADC, is limited by the feature of nonlinearity of the RC circuit as well as errors related to CPLD port potential comparators. As a result, the practical accuracy of the conversion circuit is significantly reduced.

SUMMARY

A voltage monitoring circuit is disclosed according to one embodiment of the present disclosure. The voltage monitoring circuit includes a first multiplexer, a controller, a resistor-network circuit and a first comparison circuit. The first multiplexer has a plurality of input terminals, an output terminal and a control terminal. Each of the plurality of input terminals of the first multiplexer receives a respective one of a plurality of first subject voltages. The controller is electrically connected to the control terminal of the first multiplexer. The controller controls, through the control terminal of the first multiplexer, the first multiplexer to output one of the plurality of first subject voltages from the output terminal of the first multiplexer. The controller generates a testing signal including a plurality of electric potentials. The controller has a port configured to output the plurality of electric potentials switching according to a switching command of the controller. The resistor-network circuit includes a plurality of first resistors. One terminal of each of the plurality of first resistors is connected to the controller for receiving a respective one of the plurality of electric potentials of the testing signal. The resistor-network circuit is configured to sequentially generate a plurality of first reference voltages according to switches of the plurality of electric potentials. The first comparison circuit has a first input terminal, a second input terminal and an output terminal. The first input terminal of the first comparison circuit is electrically connected to the output terminal of the first multiplexer, and the second input terminal of the first comparison circuit is electrically connected to the resistor-network circuit. The first comparison circuit is configured to sequentially compare each of the plurality of first reference voltages to the first subject voltage outputted from the first multiplexer for sequentially outputting a plurality of first comparison results. The first comparison circuit is configured to sequentially send the plurality of first comparison results to the controller through the output terminal of the first comparison circuit for determining a voltage value of the first subject voltage, wherein each of the plurality of first comparison results has electric potential information.

A voltage monitoring method adapted to a voltage monitoring circuit is disclosed according to one embodiment of the present disclosure. The method includes the following steps: controlling a multiplexer to output one of a plurality of subject voltages according to a control command of a controller; driving a plurality of electric potentials of a testing signal generated by the controller to switch according to a switching command of the controller, for performing a comparison procedure repeatedly to generate a plurality of comparison results, the comparison procedure performed repeatedly for k times; and determining a voltage value of the subject voltage outputted from the multiplexer according to the plurality of comparison results; wherein the comparison procedure includes the following steps: when the plurality of electric potentials switches for $i^{th}$ time, generating a reference voltage according to the plurality of electric potentials switching for the $i^{th}$ time, wherein k is an integer greater than three, and i is an integer less than k and greater than or equal to zero; and comparing the reference voltage to the subject voltage; wherein the switches of plurality of electric potentials comprise a switch of at least one of the he plurality of electric potentials from a high level to a low level or from the low level to the high level.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
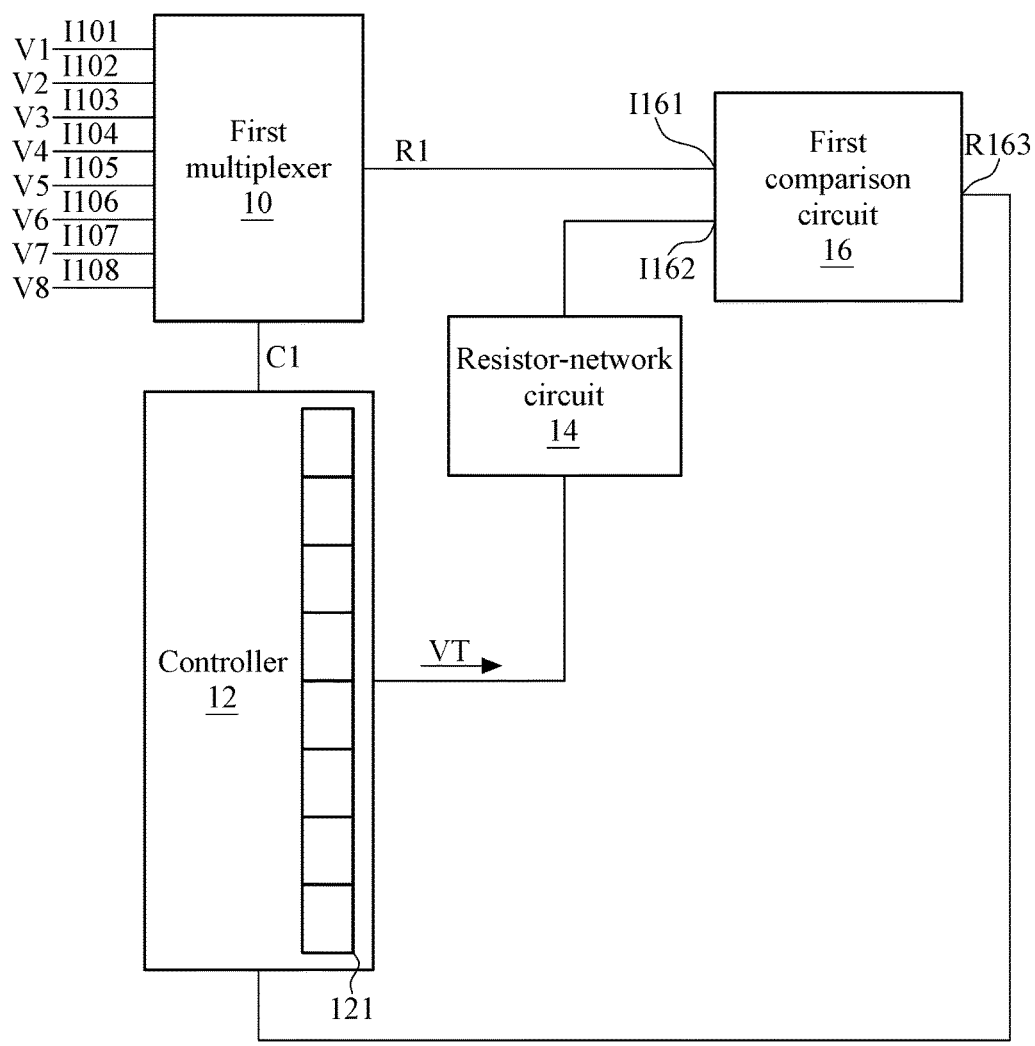
FIG. 1 is a diagram of a voltage monitoring circuit according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a diagram of a voltage monitoring circuit according to one embodiment of the present disclosure. As shown in FIG. 1, a voltage monitoring circuit 1 includes a first multiplexer 10, a controller 12, a resistor-network circuit 14 and a first comparison circuit 16. The first multiplexer 10 has a plurality of input terminals I101-I108, an output terminal R1 and a control terminal C1. Each of the plurality of input terminals of the first multiplexer 10 receives a respective one of a plurality of first subject voltages V1-V8. For example, the input terminal I101 receives the first subject voltage V1, the input terminal I102 receives the first subject voltage V2, the input terminal I103 receives the first subject voltage V3, etc. In practice, the plurality of first subject voltages V1-V8 comes from a plurality of detected channels in a server. The controller 12 is electrically connected to the control terminal C1 of the first multiplexer 10. The controller 12 controls the first multiplexer 10 through the control terminal C1 of the first multiplexer 10, so that the first multiplexer 10 outputs one of the first subject voltages V1-V8 at the output terminal R1. The controller 12 generates a testing signal VT including a plurality of electric potentials. In this embodiment, the controller 12 has a port 121 configured to output the plurality of electric potentials which switches according to a switching command of the controller 12. In practice, the plurality of electric potentials includes high levels/low levels (high level: 1, low level: 0). In one embodiment, the switches of the plurality of electric potentials includes a switch of at least one of the electric potentials from a high level to a low level or a switch of at least one of the electric potentials from a low level to a high level. For example, the switching command of the controller 12 drives the plurality of electric potentials sequentially switches from 00000000 to 11111111. In an example, the controller 12 is a complex programmable logic device (CPLD). However, the controller 12 disclosed in the present disclosure is not limited to the above example.

Figure 2:
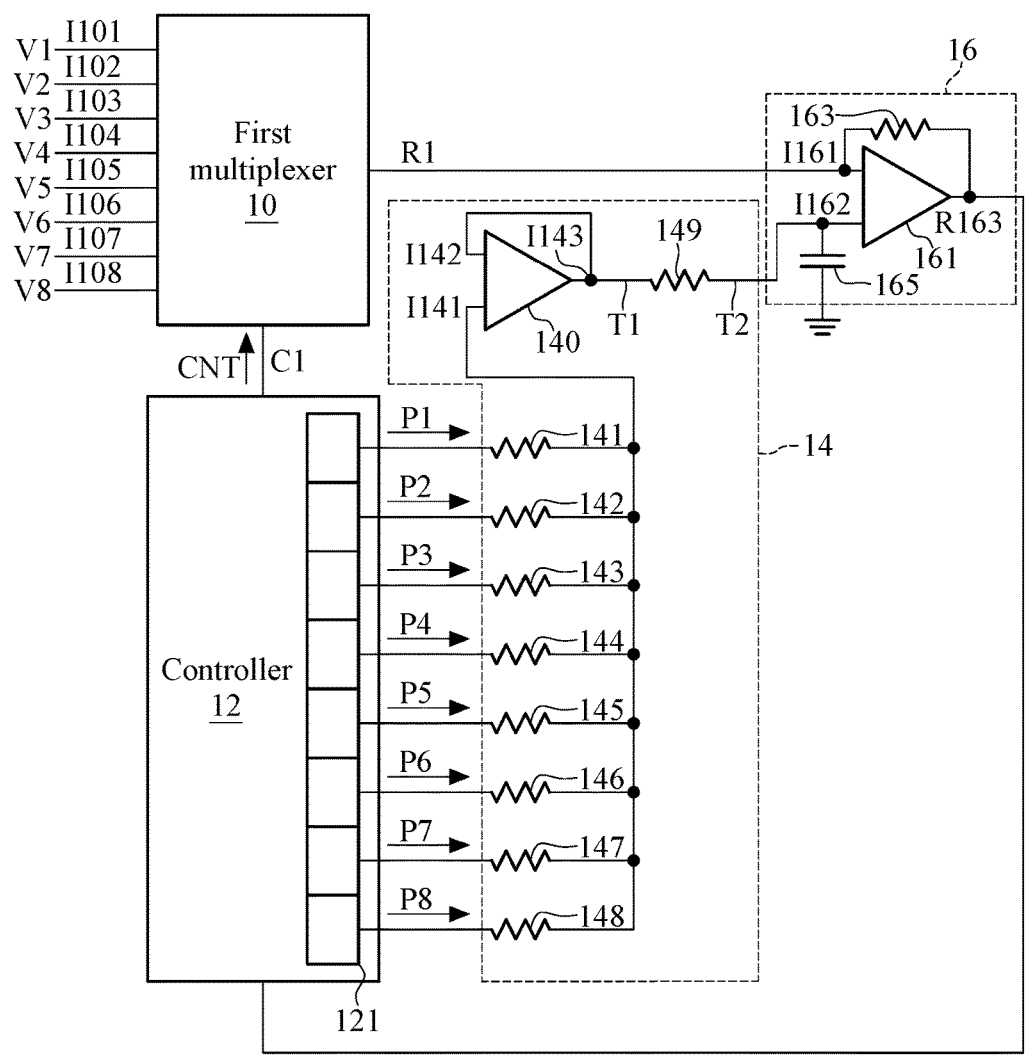
FIG. 2 is a detailed diagram of the voltage monitoring circuit according to the embodiment of FIG. 1 of the present disclosure.

Please further refer to FIG. 2, which is a detailed diagram of the voltage monitoring circuit according to the embodiment of FIG. 1 of the present disclosure. The resistor-network circuit 14 includes a plurality of first resistors 141-148. One terminal of each of the plurality of first resistors 141-148 is connected to the controller 12 so as to respectively receive the plurality of electric potentials P1-P8 included in the testing signal VT. The resistor-network circuit 14 is configured to sequentially generate a plurality of first reference voltages according to the switches of the plurality of electric potentials. Furthermore, as shown in FIG. 2, the first comparison circuit 16 has a comparator 161, a resistor 163 and a capacitor 16. The first comparison circuit 16 has a first input terminal I161, a second input terminal I162 and an output terminal R163. The first input terminal I161 of the first comparison circuit 16 is electrically connected to the output terminal R1 of the first multiplexer 10, and the second input terminal I162 of the first comparison circuit 16 is electrically connected to the resistor-network circuit 14. The first comparison circuit 16 is configured to sequentially compare each of the plurality of first reference voltages to the first subject voltage outputted by the output terminal R1, so as to sequentially generate a plurality of first comparison results. Furtherly, the first comparison circuit 16 sequentially sends the first comparison results to the controller 12 through the output terminal R163 of the first comparison circuit 16 for determining a voltage value of the outputted by the output terminal R1. Each of the first comparison results has electric potential information.

In one embodiment, as shown in FIG. 2, the resistor-network circuit 14 further includes a second resistor 149 and an amplifier 140. The second resistor 149 has a first terminal T1 and a second terminal T2. The amplifier 140 has a first terminal I141, a second terminal I142 and a third terminal R143. The first terminal I141 of the amplifier 140 is electrically connected to another terminal of each of the first resistors 141-148. The second terminal I142 of the amplifier 140 is electrically connected to the first terminal T1 of the second resistor 149 and the third terminal R143 of the amplifier 140. The plurality of first reference voltages are outputted by the second terminal of the second resistor 149, and the resistance values of the first resistors 141-148 are greater than the resistance value of the second resistor 149. In a practical example, the resistance value of the second resistor 149 is 300 ohms, and the resistance values of the first resistors 141-148 are selected based on a geometric sequence with common ratio 2 and a predetermined initial value. It means that the resistance value of the current first resistor is substantially twice as large as the resistance value of the previous first resistor. For example, the resistance values of the first resistors 141-148 are respectively 1.27 kilo ohms, 2.49 kilo ohms, 4.99 kilo ohms, 10 kilo ohms, 20 kilo ohms, 40.2 kilo ohms, 80.6 kilo ohms and 162 kilo ohms. The resistance values mentioned in the above embodiments are used for illustration only, and the present disclosure is not limited to the above embodiments. In one embodiment, the resistance values of the first resistors 141-148 are in a range of 1.27 kilo ohms to 162 kilo ohms.

A practical example is given below for illustrating the process of determining the voltage value of the subject voltage by the voltage monitoring circuit 1. Please refer to Table 1, which is a chart of voltage monitoring according to one embodiment of the present disclosure. If the voltage that the voltage monitoring circuit 1 monitors is the first subject voltages V1 initially, then the controller 12 sends a control command CNT to first multiplexer 10 through the control terminal C1 so as to turn on a current channel between the input terminal I101 and the output terminal R1. Accordingly, the first multiplexer 10 outputs the first subject voltage V1 to the first input terminal I161 of the first comparison circuit 16 through the output terminal R1. The port 121 of the controller 12 outputs the plurality of electric potentials P1-P8, and the plurality of electric potentials P1-P8 switches sequentially according to the switching command of the controller 12. More specifically, when the plurality of electric potentials P1-P8 switches once, a first reference voltage is generated correspondingly. Then, the voltage monitoring circuit 1 further compares the first subject voltages V1 to the first reference voltage generated, so as to generate a first comparison result. For example, as shown in Table 1, the initial state of the plurality of electric potentials P1-P8 outputted from the port 121 is 00000000, the first reference and voltage VR_1 is generated correspondingly and further outputted to the second input terminal I162 of the first comparison circuit 16. The first reference voltage VR_1 and the first subject voltages V1 are compared by the first comparison circuit 16 so that a first comparison result L1 is generated. Further, the first comparison result L1 is sent to the controller 12 through the output terminal R163. Then, the plurality of electric potentials P1-P8 switches to be 00000001 according to the switching command of the controller 12, and a first reference voltage VR_2 is generated correspondingly and further outputted to the second input terminal I162 of the first comparison circuit 16. The first reference voltage VR_2 and the first subject voltage V1 are compared by the first comparison circuit 16 so that the first comparison result L2 is generated. Further, the first comparison result L2 is sent to the controller 12 through the output terminal R163. By the same token, the controller 12 receives the plurality of first comparison results L1-L256 accordingly and determines the voltage value of the first subject voltage V1 according to the first comparison results L1-L256.

TABLE 1

| electric potentials | first reference voltage | first comparison results |
|---|---|---|
| 00000000 | VR_1 | L1 |
| 00000001 | VR_2 | L2 |
| 00000010 | VR_3 | L3 |
| 00000011 | VR_4 | L4 |
| 00000100 | VR_5 | L5 |
| 00000101 | VR_6 | L6 |
| 00000110 | VR_7 | L7 |
| ... | ... | ... |
| 11111100 | VR_253 | L253 |
| 11111101 | VR_254 | L254 |
| 11111110 | VR_255 | L255 |
| 11111111 | VR_256 | L256 |

In one embodiment, if the electric potentials of two first comparison results next to each other are different, then the controller 12 determines the voltage value of the first subject voltage is in a range between the two first reference voltages respectively corresponding to the two first comparison results. Refer to the example of Table 1, if electric potential information included in the first comparison results L1-L4 all remain in low levels and the first comparison result L5 is in high level, then it is indicated that the voltage value of the first subject voltage V1 is in a range between the first reference voltage VR_4 and the first reference voltage VR_5. Therefore, the voltage monitoring circuit 1 is capable of determining the voltage of the first subject voltage V1. In a practical implementation, after the controller 12 of the voltage monitoring circuit 1 completes the determination for the voltage of the first subject voltage V1, the controller 12 turns on another current channel of the first multiplexer 10 so as to output another first subject voltage. Further, the voltage value of the another first subject voltage can be determined by using the testing method of the voltage monitoring circuit as described above. In other words, in the voltage monitoring circuit 1 of the present disclosure, a multi-channel of the first multiplexer 10 is used with the switches of the electric potentials, so that the resistor-network circuit 14 sequentially outputs a plurality of reference voltages to be compared to a plurality of subject voltages. Therefore, a monitoring for the voltages from the multiple channels in the server can be achieved. By taking the advantages of the voltage monitoring circuit, the occupancy for the input/output ports of controller (e.g. CPLD) is reduced and the stabilization of the circuit in the process of monitoring voltages is raised.

Figure 3:
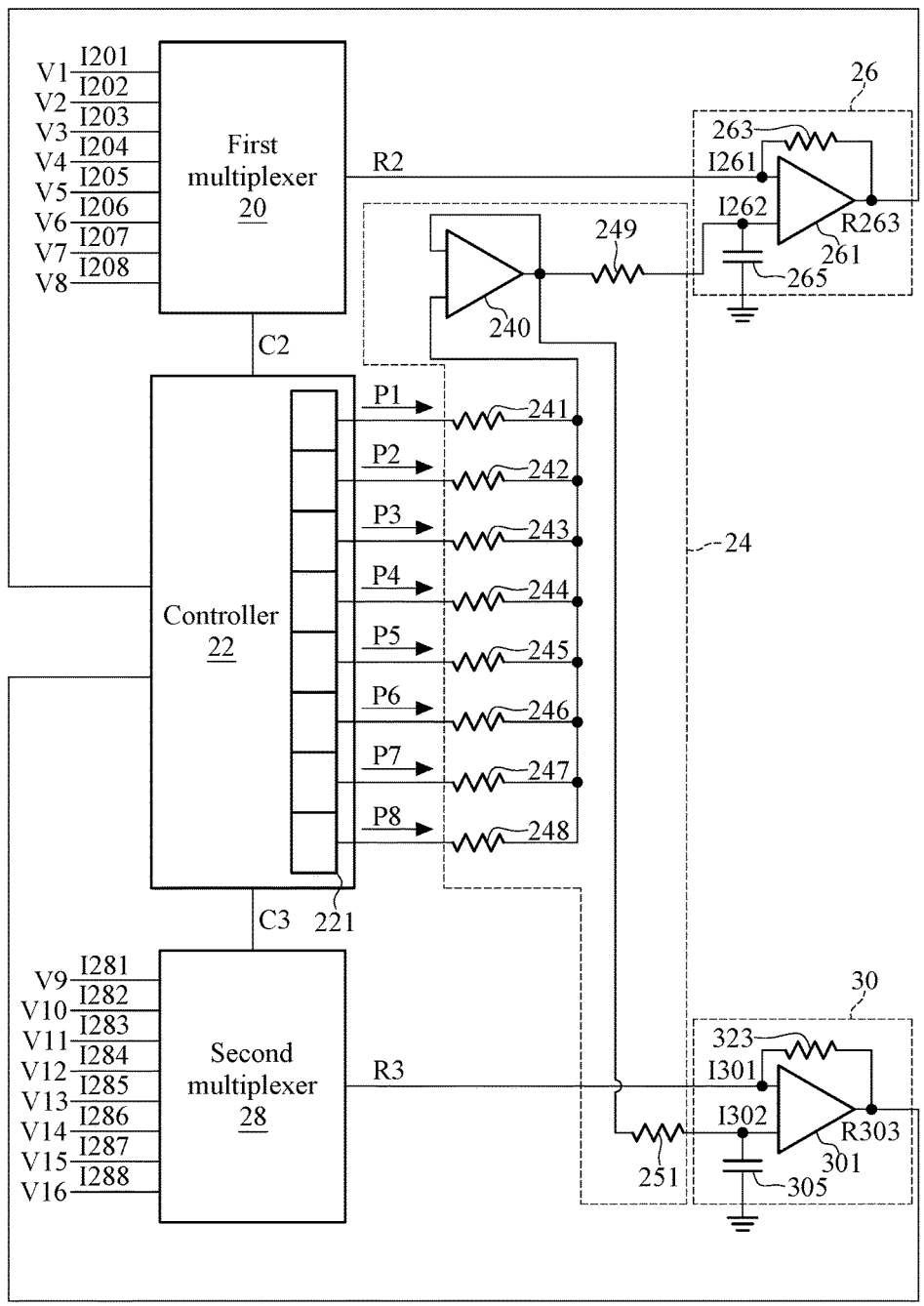
FIG. 3 is a diagram of a voltage monitoring circuit according to another embodiment of the present disclosure.

Please refer to FIG. 3, which is a diagram of a voltage monitoring circuit according to another embodiment of the present disclosure. In FIG. 3, the voltage monitoring circuit 2 includes a first multiplexer 20, a first comparison circuit 26, a second multiplexer 28, a second comparison circuit 30, a controller 22 and a resistor-network circuit 24. The first multiplexer 20 has a plurality of input terminals I201-I208, an output terminal R2 and a control terminal C2. Each of the input terminals of the first multiplexer 20 receives a respective one of the plurality of second subject voltages V1-V8. Similarly, the second multiplexer 28 has a plurality of input terminals I281-I288, an output terminal R3 and a control terminal C3. Each of the input terminals of the second multiplexer 28 receives a respective one of the second subject voltages V9-V16. The controller 22 is electrically connected to the control terminal C2 of the first multiplexer 20 and the control terminal C3 of the second multiplexer 28 respectively. The controller 22 is configured to control the first multiplexer 20 through the control terminal C2 of the first multiplexer 20, so that the first multiplexer 20 outputs one of the second subject voltages V1-V8 at the output terminal R2. Further, the controller 22 is configured to control the second multiplexer 28 through the control terminal C3 of the second multiplexer 28, so that the second multiplexer 28 outputs one of the second subject voltages V9-V16 at the output terminal R3. The port 221 in the controller 22 is capable of providing a testing signal VT including a plurality of electric potentials P1-P8. The resistor-network circuit 24 sequentially generates a plurality of first reference voltages as well as a plurality of second reference voltages according to the switches of electric potentials P1-P8. Similar to the embodiment of FIG. 2, the first comparison circuit 26 has a comparator 261, a resistor 263 and a capacitor 265, and the second comparison circuit 30 has a comparator 301, a resistor 303 and a capacitor 305. The resistor-network circuit 24 includes a plurality of first resistors 241-248, second resistors 249, 251 and an amplifier 240.

The first comparison circuit 26 has a first input terminal I261, a second input terminal I262 and an output terminal R263. The first input terminal I261 of the first comparison circuit 26 is electrically connected to the output terminal R2 of the first multiplexer 20, and the second input terminal I262 of the first comparison circuit 26 is electrically connected to the resistor-network circuit 24. The first comparison circuit 26 is configured to sequentially compare the plurality of first reference voltages to the first subject voltage outputted, so as to sequentially generate a plurality of first comparison results. Then the first comparison circuit 26 further sequentially sends the plurality of first comparison results to the controller 22 through the output terminal R263 of the first comparison circuit 26, so that the controller determines the voltage value of the first subject voltage outputted.

The second comparison circuit 30 has a first input terminal I301, a second input terminal I302 and an output terminal R303. The first input terminal I301 of the second comparison circuit 30 is electrically connected to the output terminal R3 of the second multiplexer 28, and the second input terminal I302 of the second comparison circuit 30 is electrically connected to the resistor-network circuit 24. The second comparison circuit 30 is configured to sequentially compare the second reference voltages generated to the second subject voltage outputted, so as to sequentially generate a plurality of second comparison results correspondingly. Further, the second comparison circuit 30 sends the second comparison results to the controller 22 through the output terminal R303 of the second comparison circuit 30, so that the controller 22 determines the voltage of the second subject voltage. The method of determining the voltage value of the first subject voltage and the voltage value of the second subject voltage by the voltage monitoring circuit 2 shown in FIG. 3 is similar to that shown in FIG. 2, so no more repeated here. Since internal circuit configurations in some servers may be complicated, a huge number of voltages in channels need to be monitored and tested. By taking the advantages of the voltage monitoring circuit 1 and the voltage monitoring circuit 2 disclosed in the present disclosure, voltages from 8-channel and 16-channel can be monitored and tested. Persons having ordinary skills in the art are able to further modify the configurations of the voltage monitoring circuit 1 for 32-channel voltage test and monitoring. Therefore, the occupancy for the input/output ports of controller (e.g. CPLD) is reduced and the stabilization of the circuit in the process of monitoring voltages is raised.

Figure 4:
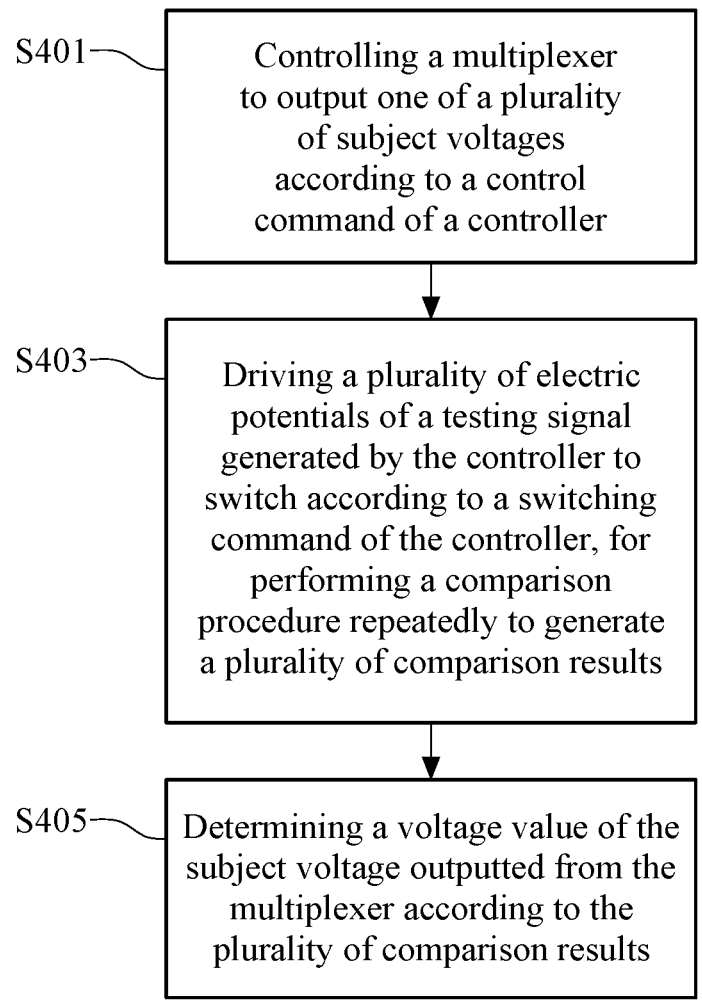
FIG. 4 is flow chart of a voltage monitoring method according to one embodiment of the present disclosure.

Refer to FIG. 4, which is flow chart of a voltage monitoring method according to one embodiment of the present disclosure. The voltage monitoring method is adapted to the voltage monitoring circuit shown in FIG. 2. As shown in FIG. 2 and FIG. 4, in step S401, the voltage monitoring circuit 1 controls the first multiplexer 10 to output one of the plurality of subject voltages (e.g. first subject voltages V1-V8) according to a control command CNT from the controller 12. In step S403, the voltage monitoring circuit 1 drives electric potentials P1-P8, included in the testing signal VT from the controller 12, to switch according to a switching command from the controller 12, for performing a comparison procedure repeatedly to generate a plurality of comparison results (e.g. first comparison results shown in Table 1), wherein the comparison procedure is performed repeatedly for k times. In step S405, the voltage monitoring circuit 1 determines the voltage value of the subject voltage, outputted by the first multiplexer 10, according to the plurality of comparison results. The comparison procedure includes the following two steps. Step I: When the plurality of electric potentials switches for a $i^{th}$ time, a reference voltage (e.g. first reference voltages shown in Table 1) is generated according to the plurality of electric potentials which switches for the $i^{th}$ time. In this embodiment, k is an integer greater than three, and i is an integer less than k and greater than or equal to zero. Step II: The reference voltage is compared to the subject voltage outputted. The switches of electric potentials P1-P8 include the switches of at least one of the plurality of electric potentials P1-P8 from a high level to a low level or from the low level to the high level.

Specifically, as indicated in the example of Table 1, the initial state of electric potentials P1-P8 is 00000000, which corresponds to the first reference voltage VR_1 generated. The first reference voltage VR_1 is compared to the first subject voltages V1 by the first comparison circuit 16, so that the first comparison circuit 16 generates the first comparison result L1 and further sends the first comparison result L1 to the controller 12. Then, the electric potentials P1-P8 switches for a first time to be 00000001 according to the switching command of the controller 12, and the first reference voltage VR_2 is generated correspondingly. The first reference voltage VR_2 is compared to the first subject voltages V1 by the first comparison circuit 16, so that the first comparison circuit 16 generates the first comparison result L2 and further sends the first comparison result L2 to the controller 12. Then, the plurality of electric potentials P1-P8 switches for a second time to be 00000010 according to the switching command of the controller 12, and the first reference voltage VR_3 is generated correspondingly. The first reference voltage VR_3 is compared to the first subject voltage V1 by the first comparison circuit 16, so that the first comparison circuit 16 generates the first comparison result L3, and further sends the first comparison result L3 to the controller 12, and so on.

In other words, each of the first reference voltages respectively generated corresponding to the switches of electric potentials in each time is compared to the outputted first subject voltage via the first comparison circuit 16, so that the first comparison circuit 16 generates the plurality of first comparison results. In this embodiment, the first comparison circuit 16 outputs a number of 256 of first comparison results to the controller 12. Then the controller 12 determines the voltage value of the outputted first subject voltage according to these first comparison results. Since the embodiments of the present disclosure is based on 8-bit of the electric potentials P1-P8, the total number of switches of the electric potentials is 255 (sequentially switches from 00000000 to 11111111). However, the present disclosure is not limited to the embodiment of 8-bit of the electric potentials P1-P8.

Figure 5:
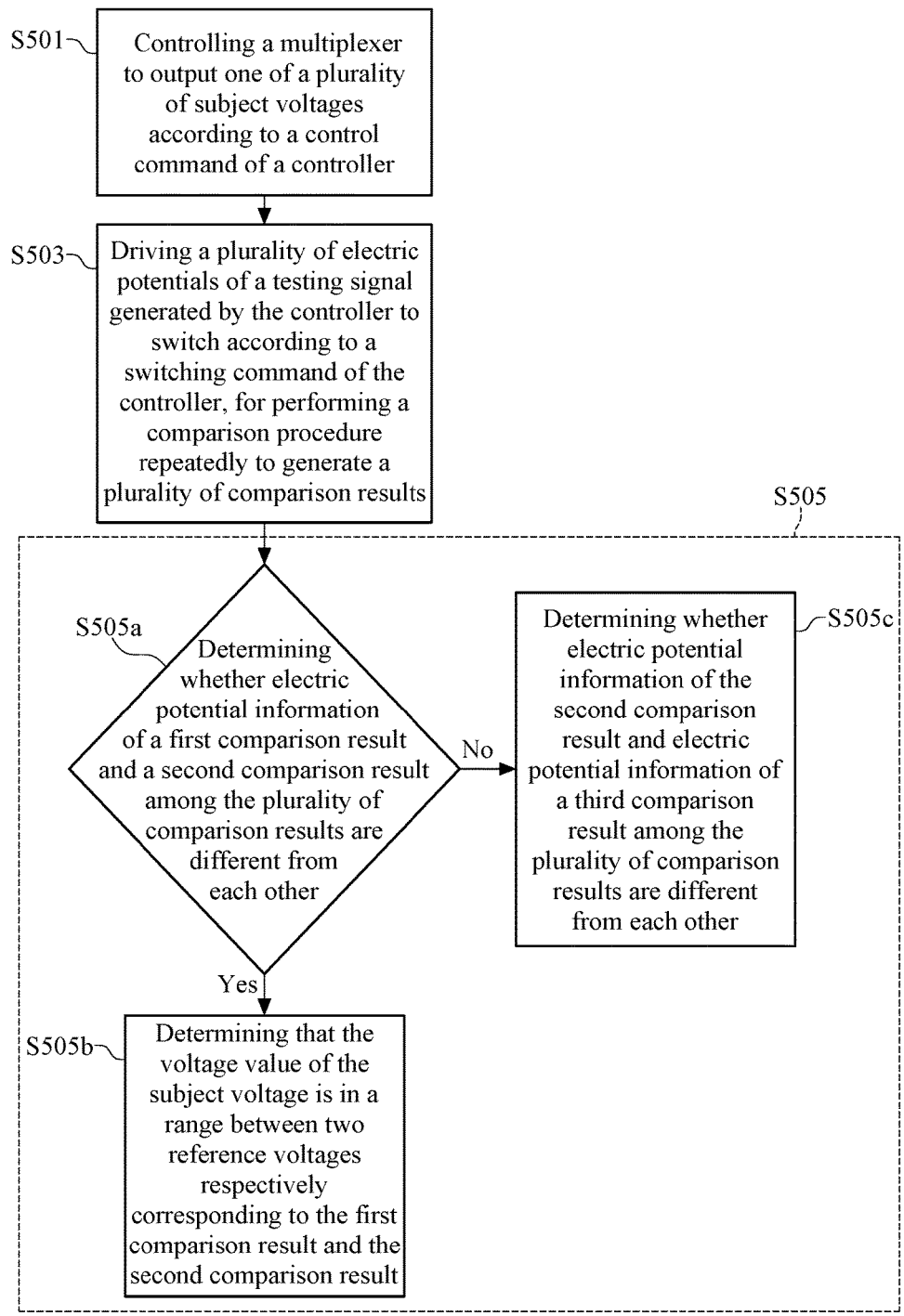
FIG. 5 is a flow chart of a voltage monitoring method according to another embodiment of the present disclosure.

Please refer to FIG. 5, which is a flow chart of a voltage monitoring method according to another embodiment of the present disclosure. As shown in FIG. 5, step S501 and step S503 are similar to step S401 and step S403. The difference between FIG. 5 and FIG. 4 lies on that step S505 of determining the voltage value of subject voltage according to the plurality of comparison results further includes steps S505a-S505c. In step S505a, the controller determines whether the electric potential information of a first comparison result among the plurality of comparison results and the electric potential information of a second comparison result among the plurality of comparison results are different from each other. When the electric potential information of a first comparison result is different from the electric potential information of the second comparison result, the controller determines the voltage value of the first subject voltage is in a range between the voltages of two reference voltages corresponding to the first comparison result and the second comparison result respectively in step S505b. Contrarily, when the electric potential information of the first comparison result is identical to the electric potential information of the second comparison result, the controller further determines whether the electric potential information of the second comparison result among the plurality of comparison results and the electric potential information of the third comparison result among the plurality of comparison results are different from each other in step S505c, wherein the third comparison result is next to the second comparison result. Refer to the example of Table 1, the controller sequentially determines electric potential information of the plurality of first comparison results. When two first comparison results among the plurality of first comparison results have the same electric potential information, a next first comparison result would be compared to the current first comparison result, wherein the next first comparison result and the current first comparison result are next to each other. For example, both of the electric potential information of the first comparison result L3 and the electric potential information of the first comparison result L4 are low levels, so the first comparison result L5, namely the next first comparison result, would be compared to the first comparison result L4, namely the current first comparison result. When two of the plurality of first comparison results next to each other have different electric potential information, it is determined that the voltage value of the first subject voltage is in a range between the two first reference voltages respectively corresponding to the two of the plurality of first comparison results. For example, the first comparison result L4 and the first comparison result L5 have different electric potential information, so it is determined that the voltage value of the first subject voltage is in a range between the first reference voltage VR_4 and the first reference voltage VR_5.

Based on the above descriptions, in the voltage monitoring circuit and the voltage monitoring method disclosed in the present disclosure, by using a multi-channel switches of the multiplexer in combination with the resistor-network circuit and the comparison circuit, a plurality of reference voltages, generated according switches of the plurality of electric potentials, are compared to a subject voltage so that the controller of the voltage monitoring circuit sequentially tests and monitors voltage values corresponding to multiple channels in the server. Therefore, the stabilization of the process of monitoring voltages corresponding to multiple channels in the server is raised and the occupancy for the input/output ports of the controller is reduced.

What is claimed is:

1. A voltage monitoring circuit, comprising:
   a first multiplexer having a plurality of input terminals, an output terminal and a control terminal, with each of the plurality of input terminals of the first multiplexer receiving a respective one of a plurality of first subject voltages;
   a controller electrically connected to the control terminal of the first multiplexer, with the controller controlling, through the control terminal of the first multiplexer, the first multiplexer to output one of the plurality of first subject voltages from the output terminal of the first multiplexer, the controller generating a testing signal comprising a plurality of electric potentials, the controller having a port configured to output the plurality of electric potentials switching according to a switching command of the controller;
   a resistor-network circuit comprising a plurality of first resistors, with one terminal of each of the plurality of first resistors connected to the controller for receiving a respective one of the plurality of electric potentials of the testing signal, the resistor-network circuit configured to sequentially generate a plurality of first reference voltages according to switches of the plurality of electric potentials; and
   a first comparison circuit having a first input terminal, a second input terminal and an output terminal, with the first input terminal of the first comparison circuit electrically connected to the output terminal of the first multiplexer, the second input terminal of the first comparison circuit electrically connected to the resistor-network circuit, the first comparison circuit configured to sequentially compare each of the plurality of first reference voltages to the first subject voltage outputted from the first multiplexer for sequentially outputting a plurality of first comparison results, the first comparison circuit configured to sequentially send the plurality of first comparison results to the controller through the output terminal of the first comparison circuit for determining a voltage value of the first subject voltage, wherein each of the plurality of first comparison results has electric potential information.

2. The voltage monitoring circuit according to claim 1, wherein, when the electric potential information of two of the plurality of first comparison results are different from each other, the controller determines that the voltage value of the first subject voltage is in a range between two first reference voltages respectively corresponding to the two of the plurality of first comparison results, the two of the plurality of first comparison results are next to each other.

3. The voltage monitoring circuit according to claim 1, wherein the switches of the plurality of electric potentials comprise a switch of at least one of the plurality of electric potentials from a high level to a low level or from the low level to the high level.

4. The voltage monitoring circuit according to claim 1, wherein the resistor-network circuit further comprises:
   a second resistor having a first terminal and a second terminal; and
   an amplifier having a first terminal, a second terminal and a third terminal, with the first terminal of the amplifier electrically connected to another terminal of each of the plurality of first resistors, the second terminal of the amplifier electrically connected to the first terminal of the second resistor and the third terminal of the amplifier, the plurality of first reference voltages outputted from the second terminal of the second resistor, wherein resistance values of the plurality of first resistors are all greater than a resistance value of the second resistor.

5. The voltage monitoring circuit according to claim 1, wherein the plurality of first resistors are k resistors, a resistance value of $(i+1)^{th}$ resistor is substantially twice as large as a resistance value of an $i^{th}$ resistor of the k resistors, k is an integer greater than one, and i is an integer greater than zero and less than k.

6. The voltage monitoring circuit according to claim 1, wherein a resistance value of each of the plurality of first resistors is in a range between 1.27 kilo ohms and 162 kilo ohms.

7. The voltage monitoring circuit according to claim 1, further comprising:
   a second multiplexer having a plurality of input terminals, an output terminal and a control terminal, with each of the plurality of input terminals of the second multiplexer receiving a respective one of a plurality of second subject voltages, the controller electrically connected to the control terminal of the second multiplexer, the controller configured to control, through the control terminal of the second multiplexer, the second multiplexer to output one of the plurality of second subject voltages from the output terminal of the second multiplexer, wherein the resistor-network circuit is further configured to sequentially generate a plurality of second reference voltages according to the switches of the plurality of electric potentials; and
   a second comparison circuit having a first input terminal, a second input terminal and an output terminal, with the first input terminal of the second comparison circuit electrically connected to the output terminal of the second multiplexer, the second input terminal of the second comparison circuit electrically connected to the resistor-network circuit, the second comparison circuit configured to sequentially compare each of the plurality of second reference voltages to the second subject voltage outputted from the second multiplexer for sequentially outputting a plurality of second comparison results, the second comparison circuit configured to sequentially send the plurality of second comparison results to the controller through the output terminal of the second comparison circuit for determining a voltage value of the second subject voltage.

8. A voltage monitoring method adapted to a voltage monitoring circuit, comprising:
   controlling a multiplexer to output one of a plurality of subject voltages according to a control command of a controller;
   driving a plurality of electric potentials of a testing signal generated by the controller to switch according to a switching command of the controller, for performing a comparison procedure repeatedly to generate a plurality of comparison results, the comparison procedure performed repeatedly for k times; and
   determining a voltage value of the subject voltage outputted from the multiplexer according to the plurality of comparison results;
   wherein the comparison procedure comprising:
      when the plurality of electric potentials switches for $i^{th}$ time, generating a reference voltage according to the plurality of electric potentials switching for the $i^{th}$ time, wherein k is an integer greater than three, and i is an integer less than k and greater than or equal to zero; and comparing the reference voltage to the subject voltage;

wherein switches of plurality of electric potentials comprise a switch of at least one of the plurality of electric potentials from a high level to a low level or from the low level to the high level.

9. The voltage monitoring method according to claim 8, wherein determining the voltage value of the subject voltage outputted from the multiplexer according to the plurality of comparison results comprises:

determining whether electric potential information of a first comparison result and a second comparison result among the plurality of comparison results are different from each other, wherein the first comparison result is next to the second comparison result;

determining that the voltage value of the subject voltage is in a range between two reference voltages respectively corresponding to the first comparison result and the second comparison result; and determining whether electric potential information of the second comparison result and electric potential information of a third comparison result among the plurality of comparison results are different from each other when the electric potential information of the first comparison result is identical to the electric potential information of the second comparison result, wherein the third comparison result is next to the second comparison result.

* * * * *